United States Patent [19]

Brault

[11] Patent Number: 4,508,812

[45] Date of Patent: Apr. 2, 1985

[54] METHOD OF APPLYING POLY(METHACRYLIC ANHYDRIDE RESIST TO A SEMICONDUCTOR

[75] Inventor: Robert G. Brault, Santa Monica, Calif.

[73] Assignee: Hughes Aircraft Company, El Segundo, Calif.

[21] Appl. No.: 606,506

[22] Filed: May 3, 1984

[51] Int. Cl.$^3$ .......................................... H01L 21/316
[52] U.S. Cl. ..................................... 430/270; 427/82; 427/385.5; 427/407.1; 430/272; 430/296; 430/935
[58] Field of Search .................... 427/82, 385.5, 407.1; 430/270, 272, 296, 935

[56] References Cited

U.S. PATENT DOCUMENTS

| | | | |
|---|---|---|---|
| 3,779,806 | 12/1973 | Gipstein | 427/82 |
| 4,087,569 | 5/1978 | Hatzakis | 430/296 |
| 4,264,715 | 4/1981 | Miura | 430/296 |
| 4,476,217 | 10/1984 | Douglas | 430/270 |

*Primary Examiner*—John D. Smith
*Attorney, Agent, or Firm*—David W. Collins; Anthony W. Karambelas

[57] ABSTRACT

Disclosed is a method of pretreating a semiconductor wafer so that a solution coating of a positive resist of poly(methacrylic anhydride) can be directly applied to the treated surface. A typical semiconductor wafer of silicon is first precoated with a thin layer of poly(t-butyl methacrylate) and then heated to convert the poly(t-butyl methacrylate) to the anhydride. The thickness of this anhydride-precursor layer is less than about 1,000 Angstroms. Next, there is applied to the surface of the precursor layer a solution of the poly(methacrylic anhydride) dissolved in, for example, dimethylacetamide, dimethylformamide, or N-methylprrolidione. Such solvents, which are not capable of adequately wetting the silicon surface directly, are capable of wetting the precursor layer comprising poly(methacrylic anhydride), thus ensuring a uniform deposit of poly(methacrylic anhydride) upon the treated surface of the wafer. After the solution has been applied to the treated wafer, the solvent is removed by evaporation to form a uniform solution-deposited poly(methacrylic anhydride) layer having a thickness which ranges from about 2,000 Angstroms to about 20,000 Angstroms.

12 Claims, No Drawings

METHOD OF APPLYING POLY(METHACRYLIC ANHYDRIDE) RESIST TO A SEMICONDUCTOR

The Government has rights in this invention pursuant to Contract No. N00019-80-C-0616 awarded by the Department of the Navy.

BACKGROUND OF THE INVENTION

1. Field of the Invention

This invention relates to a positive resist of the type used in the fabrication of microcircuits, and particularly to a positive resist of poly(methacrylic anhydride).

2. Description of the Prior Art

Advances in modern electronics have produced the well known silicon "chip." This silicon chip contains all the elements of an electronic circuit such as transistors, capacitors, etc., which are interconnected by metallic strips on the surface of the chip. Reduction in circuit size has reduced the cost per function of these chips and increased the switching speed of the various logic functions of the circuits.

These chips are produced using photolithographic techniques, including electron-beam lithography. Such photolithographic techniques are discussed in a paper entitled, "Electron Radiation of Polymers and its Application to Resists for Electron-Beam Lithography" by M. J. Bowden, published in *CRC Circuit Review Solid State Materials Science*, 1978 (published 1979) 8223-64.

Briefly, the photolithographic process calls for the semiconductor surface of the wafer substrate to be coated with a polymeric resist. The coated substrate is then exposed in selected areas to a radiation source such as ion beam, X-ray, or electron-beam, any of which upon striking the resist changes the chemical properties of the resist. One material which has been utilized advantageously as a positive resist in the electron-beam lithographic process is poly(methacrylic anhydride) (PMAH).

The surface of the semiconductor wafer must be coated with the PMAH film prior to exposure to the radiation source such as electron beam. However, the solvents for PMAH, for example, dimethylacetamide, dimethylformamide and N-methylprrolidione do not adequately wet the semiconductor wafer surface, particularly silicon, to provide a uniform coating. Thus, the PMAH film is currently prepared by first applying a solution coating of poly(t-butyl methacrylate) (PTBMA) to the surface of the wafer. PTBMA is then heated to above 200° C. for two to three hours to convert the coating to a film of PMAH. The problem with this method is that there is significant variation in the composition and consistency of the resist produced, and quality control is difficult. There can be incomplete conversion of the PTBMA to PMAH, depending on the uniformity of process conditions, particularly temperature within the process oven. As a result, there are areas of the film coating which can contain both PTBMA and PMAH. During subsequent steps in the photolithograpahic process, the irradiated resist area is dissolved, and thus removed from the wafer surface, upon exposure to development solvent. Since the PTBMA in the nonirradiated areas is more soluble in these development solvents than the PMAH in the same areas, the resist film structure remaining on the wafer surface may be uneven and inconsistent. In addition, the reaction to convert PTMBA to PMAH results in the liberation of isobutylene and water by-products. Although these by-products are in gaseous form under the reaction conditions, bubbles of the gases can remain trapped in the polymeric film coating, creating areas of varying continuity and integrity. Control of the reaction parameters in order to produce a consistent resist product under the conditions described above is very burdensome and frequently inadequate. This invention is concerned with a method which permits at least the majority of the PMAH positive resist to be applied directly to the prepared semiconductor wafer surface, so that the above-described problems can be avoided.

SUMMARY OF THE INVENTION

In accordance with the invention, a method is provided for coating a semiconductor wafer material with poly(methacrylic anhydride) (PMAH) in a way that avoids the quality control problems which occur using conventional coating procedures. According to the method of the invention, the wafer is first precoated with a thin precursor layer of PTBMA which is then heated to a temperature at which the PTBMA is converted to PMAH, to form a thin, relatively uniform layer of PMAH. A solution of PMAH is then applied over this precursor layer so that a uniformly distributed coating of the desired thickness of PMAH is obtained upon the pre-coated surface of the semiconductor wafer.

The method of this invention requires two applications of resist material in comparison with the prior art which requires only one. However, it offers the advantage of direct application of PMAH to the pre-treated semiconductor wafer surface. Although the pretreatment (first application) step provides a thin coating of PMAH which may have the defects described in the "Description of the Prior Art," the second application step permits the majority—up to at least 99%—of the PMAH resist to be directly applied from solution, so that the resist is substantially free from the defects generated by the use of the prior art single application process. It should be noted that a typical positive resist is about 5,000 to 10,000 Angstroms thick, whereas the pretreatment coating used in the process of the invention is typically less than about 1,000 Angstroms. Thus, this method enables one to use PMAH as a positive resist without the quality control problems heretofore experienced. This method also permits the continuity and integrity of the resist to be controlled with great accuracy. In addition, because the wafer is pre-coated, a more uniform and smoother surface of PMAH is obtained.

This invention is further illustrated by the following detailed description and example.

DETAILED DESCRIPTION OF THE INVENTION

According to the method of the invention, the semiconductor is first pre-coated with a thin precursor layer of PTBMA. The PTBMA is applied from a solution wherein the solvent is a good wetting agent for the semiconductor as well as a good solvent for PTBMA. In the case of a silicon wafer, a solvent such as toluene works well. The thin precursor layer of PTBMA is then heated to about 200° C. to 250° C. in order to convert the PTBMA to PMAH. A solution of PMAH in a solvent such as dimethylacetamide, dimethylformamide, or N-methylpyrrolidione then applied over the precursor layer; the solution conveniently comprises about 2 to about 10% by weight of PMAH. Although these solvents are not capable of wetting the silicon wafer itself, they are capable of wetting the precursor layer on the wafer. Upon applying the PMAH dissolved in solvent, the solvent is removed by evaporation to form a relatively thick layer of PMAH which adheres firmly to the precursor layer on the wafer surface. The overall thickness of the polymeric resist then on the wafer surface depends on the contribution from each application of resist material. It is not known whether the resultant composite resist is comprised of two layers wherein the first layer is bonded to the semiconductor substrate and the second layer is bonded to the first layer, or whether the two layers meld together to become one indistinguishable layer. The resist performs in substantially the same manner regardless of the exact structure of the composite formed. Typically, the contribution from the first application of material is less than 1,000 Angstroms, and preferably between 250 and 500 Angstroms, in order to minimize the fraction of the overall resist which could exhibit the problem characteristics described in the prior art. The contribution from the second application of material is typically at least equal to the thickness of the layer deposited during the first application of material, and preferably ranges between about 2,000 Angstroms and 20,000 Angstroms. The preferred composite of resist then would have a 250 to 500 Angstrom thick contribution from the first application of material and a 2,000 to 20,000 Angstrom thick contribution from the second application of material.

EXAMPLE

A silicon wafer having a a thickness of 10–15 mils and a diameter of 2 inches was first pre-coated with a solution of PTBMA dissolved in toluene. A 2% by weight PTBMA solution was used. The wafer was placed on a conventional spin coating rig, which held the wafer in position by vacuum while the wafer was rotated rapidly at approximately 5,000 rpm. While rotating, approximately 0.5–1 cubic centimeters of the PTBMA-toluene solution was applied to the central portion of the wafer. The solution flowed outwardly, essentially instantaneously, over the surface of the wafer and at the same time the toluene evaporated, leaving on the surface of the wafer a thin layer or film of PTBMA approximately 250 to 300 Angstroms thick. The wafer was then heated in an oven for one hour at a temperature of 215° C. This converted the PTBMA film to a film or layer of substantially PMAH having a thickness of about 250 Angstroms. A 5.3 weight % solution of PMAH in N-methylpyrrolidine was then applied using the above described spin coating procedure to provide a smooth and uniform composition resist layer. The total thickness of the resist film comprising both the converted and solution-deposited PMAH was approximately 5,000 Angstroms.

The above description presents the best mode contemplated for carrying out the present invention. This invention is, however, susceptible to modifications and alternate constructions from the embodiment described above. Consequently, it is not the intention to limit this invention to the particular embodiment disclosed. On the contrary, the intention is to cover all modifications and alternate constructions falling within the spirit and scope of the invention as expressed in the appended claims.

What is claimed is:

1. A method of coating a semiconductor wafer with a positive resist of poly(methacrylic anhydride), comprising the steps of:
   (a) coating the wafer with a thin layer of poly(t-butyl methacrylate);
   (b) heating the pre-coated wafer to a temperature at which the poly(t-butyl methacrylate) is converted to poly(methacrylic anhydride) to form on the surface of the wafer a thin, relatively uniform precursor layer of said anhydride;
   (c) applying to said anhydride surface a solution of poly(methacrylic anhydride); and
   (d) removing the solvent from said solution so that a uniform coating of the desired thickness of poly(methacrylic anhydride) is obtained upon the pre-coated surface of the semiconductor wafer.

2. The method of claim 1 wherein the anhydride layer of step (b) has a thickness which is less than about 1,000 Angstroms.

3. The method of claim 2 wherein the thickness of the step (b) layer ranges between about 250 and about 500 Angstroms.

4. The method of claim 1 wherein the pre-coated wafer is heated to a temperature in the range from about 200° to about 250° C. to form the anhydride layer of step (b).

5. The method of claim 1 wherein the composition of the step (c) solution comprises from about 2 to about 10 weight % of the anhydride.

6. The method of claim 5 wherein the solvent is selected from the group consisting of dimethylacetamide, dimethylformamide, and N-methylpyrrolidione.

7. The method of claim 1 wherein the overall thickness of resist coating on the semiconductor surface after the step (d) solvent removal is at least two times that of the step (b) precursor layer.

8. The method of claim 1 wherein the overall thickness of resist coating on the semiconductor wafer after the step (d) solvent removal is at least about 2,000 Angstroms.

9. The method of claim 8 wherein the overall thickness of resist coating on the semiconductor wafer after the step (d) solvent ranges from about 2,000 to about 20,000 Angstroms.

10. A method of coating a wafer of silicon material with an electron-beam resist of polymethacrylic anhydride, comprising the steps of:
    (a) forming on the surface of the wafer a layer of poly(t-butyl methacrylate) and heating the wafer to a temperature between about 200° C. to 250° C. to convert the poly(t-butyl methacrylate) into poly(methacrylic anhydride) and thereby form on the surface of the wafer a thin, relatively uniform precursor layer of said anhydride which has a thickness less than about 1,000 Angstroms;
    (b) applying to the surface of the precursor layer a solution of poly(methacrylic anhydride) dissolved in a solvent selected from the group consisting of dimethylacetamide, dimethylformamide, and N-methyl-pyrrolidione; and
    (c) removing the solvent from said solution by evaporation so that a uniformly distributed resist coating is formed, wherein at least the majority of said resist coating is attributable to the poly(methacrylic anhydride) deposited from said solution.

11. The method of claim 10 wherein the thickness of the step (a) layer ranges between about 250 and about 500 Angstroms.

12. The method of claim 10 wherein the overall portion of the resist coating formed in step (c) ranges from about 2,000 to about 20,000 Angstroms.

* * * * *